United States Patent [19]
Harris

[11] Patent Number: 5,804,483
[45] Date of Patent: Sep. 8, 1998

[54] METHOD FOR PRODUCING A CHANNEL REGION LAYER IN A SIC-LAYER FOR A VOLTAGE CONTROLLED SEMICONDUCTOR DEVICE

[75] Inventor: Christopher Harris, Sollentuna, Sweden

[73] Assignee: ABB Research Ltd., Zurich, Switzerland

[21] Appl. No.: 689,267

[22] Filed: Aug. 6, 1996

[51] Int. Cl.$^6$ .................... H01L 21/336; H01L 21/332
[52] U.S. Cl. .................... 438/268; 438/931; 438/135
[58] Field of Search ........... 437/24, 100; 148/DIG. 148; 438/268, 931, 135

[56] References Cited

U.S. PATENT DOCUMENTS

| | | | |
|---|---|---|---|
| 3,451,867 | 6/1969 | Taft, Jr. et al. | 148/DIG. 148 |
| 4,028,149 | 6/1977 | Dienes et al. | 437/100 |
| 4,570,328 | 2/1986 | Price et al. | |
| 4,947,218 | 8/1990 | Edmond et al. | 437/100 |
| 5,318,915 | 6/1994 | Baliga et al. | 437/100 |
| 5,322,802 | 6/1994 | Baliga et al. | 437/24 |
| 5,348,895 | 9/1994 | Smayling et al. | |
| 5,459,809 | 10/1995 | Baliga et al. | 437/559 |
| 5,597,744 | 1/1997 | Kamiyama et al. | 437/100 |
| 5,635,412 | 6/1997 | Baliga et al. | 437/100 |

FOREIGN PATENT DOCUMENTS

| | | | |
|---|---|---|---|
| 0113435 | 6/1985 | Japan | 437/100 |
| WO 96/19834 | 6/1996 | WIPO | |

*Primary Examiner*—John Niebling
*Assistant Examiner*—Michael S. Lebentritt
*Attorney, Agent, or Firm*—Pollock, Vande Sande & Priddy

[57] ABSTRACT

In a method for producing a channel region layer in a SiC-layer for producing a voltage controlled semiconductor device n-type dopants and p-type dopants are implanted into a near-surface layer of the SiC layer. The p-type dopants implanted have a higher diffusion rate in SiC than the n-type dopants implanted. The SiC-layer is then heated at such a temperature that p-type dopants implanted diffuse from the near-surface layer into the surrounding regions of the SiC-layer being lightly n-doped to such a degree that a channel region layer in which p-type dopants dominates is created.

14 Claims, 1 Drawing Sheet

METHOD FOR PRODUCING A CHANNEL REGION LAYER IN A SIC-LAYER FOR A VOLTAGE CONTROLLED SEMICONDUCTOR DEVICE

TECHNICAL FIELD

The present invention relates to a method for producing a doped p-type channel region layer having on laterally opposite sides thereof doped n-type regions in a SiC-layer, for producing a voltage-controlled semiconductor device. This invention also relates to a voltage-controlled semiconductor device produced by using such a method.

BACKGROUND OF THE INVENTION

Such a method may be used for producing any voltage-controlled semiconductor device, such as for instance MISFETs, MOSFETs, and IGBTs. This type of semiconductor devices of SiC may especially be used as switching devices in power applications due to the possibility of turning them on and off very rapidly. Such devices made of SiC are particularly well suited for high power applications, since such applications make it possible to benefit from the superior properties of SiC especially in comparison with Si, namely the capability of SiC to function well under extreme conditions. These properties involving a high thermal stability, a high thermal conductivity, and a high breakdown voltage are well known in the art. However, another well known feature of SiC, namely the extremely low diffusivity of dopants at convenient temperatures therein, has until now made it very difficult to produce a channel region layer, especially one having a narrow width, for a voltage-controlled semiconductor device of SiC in a simple and reliable manner. For instance, for Si, there is no problem producing such channel region layers, since the diffusion technique functions in an excellent way for Si.

SUMMARY OF THE INVENTION

The object of the present invention is to provide a method of the type defined in the introduction, which makes it possible to produce a channel region layer in a voltage controlled semiconductor device for SiC in a simple and, thereby, a commercially interesting way.

This object is, according to the invention, obtained by producing such a method with the steps of:

1) applying a masking layer on top of a SiC-layer which is lightly n-doped;
2) etching an aperture in the masking layer extending to the SiC layer;
3) implanting n-type dopants into an area of the SiC-layer defined by the aperture for obtaining a high doping concentration of n-type in a near-surface layer of the SiC-layer under the area;
4) implanting p-type dopants having a considerably higher diffusion rate in SiC than the n-type dopants implanted in step 3) into an area of the SiC-layer defined by the aperture to such a degree that the doping type of the near-surface layer created by carrying out step 3) is maintained;
5) heating the SiC-layer at such a temperature that p-type dopants implanted in step 4) in the near-surface layer diffuse into the surrounding regions of the SiC-layer being lightly n-doped to such a degree that a channel region layer in which p-type dopants dominate is created laterally to the highly doped n-type near-surface layer and between this layer and lightly n-doped regions of the SiC-layer.

The p-type dopants are implanted in step (4) to such a degree that the doping type in the lightly n-doped regions closest to the highly doped n-type near-surface layer may be shifted to p-type through diffusion of the p-type dopants. Steps (3) and (4) are carried out in one of a) the order mentioned, and b) first step (4), and then step (3).

Accordingly, the invention is based on the understanding that the diffusion technique may, after all, also be used for SiC to create a channel region layer having a width easily controlled and which may be made very narrow when so desired. Thus, the invention utilizes the fact that some acceptors have a substantially higher diffusion rate in SiC than donors, which almost do not diffuse in SiC at all. By implanting dopants of different doping types in the near-surface layer and heating this layer, p-type dopants will diffuse out thereof for forming the channel region layer while the n-type dopants implanted will stay in the near-surface layer. It is apparent to those skilled in the art that the width of the channel region layer produced in this way may easily be controlled by controlling the time period during which it is heated and the temperature at which it is heated in step (5). Thus, such a channel region layer may be given any width, and very short channels resulting in the lower on-state resistance of the device may, in this way, easily be obtained without the requirement of any delicate process steps of a very high accuracy, since the channel is not defined by lithography.

According to a preferred embodiment of the invention, the implantation in step (3) is carried out to different depths into the SiC-layer defined by the aperture, so that p-type dopants are implanted deeply into the area for creating a deep layer of p-type under the near-surface layer of n-type created in step (3). By such deep implantation, it is possible to create a device having a DMOS-type of structure in SiC. A more appropriate name for such a device would be a VIMOS (i.e., Vertical Implanted MOS), but it is emphasized that this embodiment also, of course, covers the case of producing other types of voltage-controlled semiconductor devices of SiC having a deeply implanted layer, such, as, for instance, IGBTs.

According to another preferred embodiment of the invention, boron is implanted as p-type dopant in step (4). The diffusion rate of boron in SiC is comparatively high for SiC circumstances, since boron has rather small atoms, at annealing temperatures not that high, so that the channel region layer may, by using boron as the dopant, be easily created in a commercially favorable period of time without the necessity of using excessively high heating temperatures. Instead, annealing temperature in the order of 1,700° C. for making the dopants implanted will do well.

According to another preferred embodiment of the invention, beryllium is implanted as p-type dopant in step (4). Beryllium has nearly the same diffusivity in SiC as boron, but it has the severe disadvantage of being highly toxic.

According to another preferred embodiment of the invention, the masking layer is applied in step (1) by applying an insulating layer of AlN on top of the SiC-layer, and a layer of a refractory material which is a conductor of electricity on top of the AlN-layer. These two layers are left on the SiC-layer during step (5) for forming the gate insulating layer and the gate electrode, respectively, of the voltage-controlled semiconductor device produced by using this method. By using AlN as the material or the gate insulating layer and a refractory material as gate electrode, the preferred self-alignment technique may be used to produce the device, so that a gate electrode will be self-aligned with respect to the border of the channel region layer to the highly doped n-type near-surface layer. Such a method includes very few masking steps and thereby can be commercially very competitive.

According to a preferred further development of the embodiment last mentioned, TiN is applied in step (1) on top of the insulating layer to form the layer for the gate electrode. The use of TiN as a refractory metal for the gate is advantageous, since TiN forms a stable interface with AlN. These two materials may, without problem, withstand the high temperatures necessary to carry out the step of diffusion in SiC.

The invention also comprises a method for producing a voltage-controlled semiconductor device of SiC, being one of a) a MISFET and b) an IGBT, comprising the steps of:

6) epitaxially growing on top of each other the following semiconductor layers of SiC: a highly doped substrate layer being for a) of n-type and for b) of p-type, for a) on top thereof a low doped n-type drift layer and, for b) on top thereof either c) a highly doped n-type buffer layer and a low doped n-type drift layer or d) a low doped n-type drift layer.

This method is characterized in that it also comprises the following steps:

7) carrying out the steps according to one of the embodiments described above according to one of the two orders described for forming a doped n-type source region layer, a doped p-type base layer located thereunder and a doped p-type channel region layer;

8) depositing a source in contact with the highly doped n-type source region layer;

9) applying a passivation layer on top of the layers of the device;

10) etching an aperture through the passivation layer to the gate electrode and applying means for an external contact thereto.

The above method is very advantageous since it comprises very few masking steps, namely only four such steps, which is a very low number for the production of semiconductor devices of this type. It is, in fact, the number of masking steps that to a large extent determines the production costs of a semiconductor component, since the material constitutes a negligible part of the cost. Accordingly, this method is very preferred and is well suited for commercial production of voltage-controlled semiconductor devices of SiC.

According to another preferred embodiment of the invention, this method also comprises a step of etching a groove through the highly doped n-type source region layer and into the p-type base layer located thereunder, this step being carried out before step (8), and the source is deposited in the groove to form a contact with both the p-type base layer and the n-type source region layer. Preferably, the source is arranged into contact with the base layer in this way to stabilize the device against potential fluctuations.

The invention also involves voltage-controlled semiconductor devices of SiC produced by a method comprising the steps according to any of the appended method claims. The advantages of such devices will clearly appear from what is described above.

Further advantages and preferred features of the invention will appear from the description and the other dependent claims.

BRIEF DESCRIPTION OF THE DRAWINGS

With reference to the appended drawings, a specific description of a preferred embodiment of the invention is provided as an example.

In the drawings.

DETAILED DESCRIPTION OF A PREFERRED EMBODIMENT(S)

Figure 1:
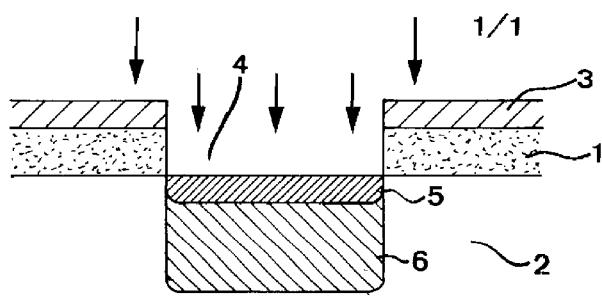
FIGS. 1 and 2 are schematic cross-section views illustrating the two main steps of a method for producing a channel region layer in a SiC-layer for manufacturing a voltage-controlled semiconductor device according to a preferred embodiment of the invention.
Figure 2:
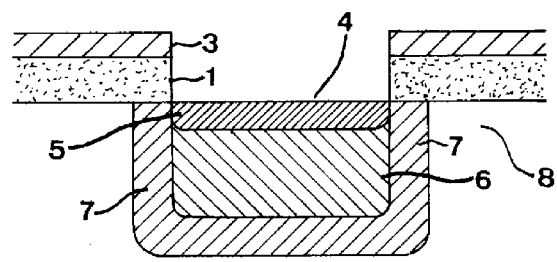

A method for producing a channel region layer in a SiC-layer for manufacturing a voltage-controlled semiconductor device will now be described with reference to FIGS. 1 and 2. Conventional semiconductor device producing steps which are irrelevant to the invention have, for the sake of clarity, not been shown in the figures.

First, an insulating layer 1 of AlN is applied on top of a SiC-layer 2 which is lightly n-doped, preferably at a doping concentration of about $10^{15}$ cm$^{-3}$ with a suitable donor, such as for instance N or P. The SiC-layer is monocrystalline, and due to the good lattice-match of monocrystalline AlN with SiC, the AlN-layer may be applied on the SiC-layer while obtaining a high interface quality between the layers 1 and 2 by, for example, CVD. A further layer 3 of a refractory material being a conductor of electricity, preferably TiN, is applied on top of the AlN-layer. An aperture 4 is then etched through the layers 1 and 3 and to the surface of the SiC-layer.

N-type dopants are then implanted into an area of the SiC-layer defined by the aperture to form a high doping concentration of donors in a near-surface layer 5 of the SiC-layer under the area. Any type of donors suitable for SiC may be used, such as for instance N and P. Thereafter, p-type dopants, having a considerably higher diffusion rate in SiC than the n-type dopants implanted for forming the layer 5, are implanted into the area of the SiC-layer defined by the aperture to such a degree that the doping type of the near-surface layer is maintained, i.e., the donors do still dominate in this layer.

The implantation of the p-type dopants is carried out to different depths, i.e., while using different acceleration energies therefor into the SiC-layer, so that p-type dopants are implanted deeply into this area when high energies, such as 300 keV, are used for creating a deep layer 6 of p-type under the layer 5. This implantation is preferably carried out so that the layer 6 will be highly doped. Acceptors having a reasonably high diffusion rate in SiC are boron, beryllium and aluminum. Boron is preferred, since beryllium is highly toxic and aluminum requires temperatures of about 2,000° C. to obtain a reasonable diffusion rate, whereas the corresponding temperature for boron is about 1,700° C. The SiC-layer is then heated at such a temperature that p-type dopants implanted in the layers 5 and 6 diffuse into the surrounding regions of the SiC-layer, being lightly n-doped to such a degree that a layer 7, surrounding the layers 5 and 6 and in which p-type dopants dominate, is created. Accordingly, a channel region layer 7 is, in this way, created laterally to the layer 5, and between this layer and lightly n-doped regions 8 of the SiC-layer. Accordingly, it is important that the p-type dopants are implanted in at least the near-surface layer 5 to such a degree that the doping type in the lightly n-doped regions closest to the highly doped n-type near-surface layer 5 may be shifted to p-type through diffusion and the p-type dopants. As a result, the doping concentration of the acceptors in the layer 5 may be chosen to be, for example, $10^{17}$–$10^{18}$ cm$^{-3}$.

The channel region layer 7 will be lightly p-doped. The width of the channel region layer may be controlled by selecting the temperature at which it is heated and the period of time for such heating, so that very narrow channel region layers may thus be obtained if desired. Because AlN and the layer 3 of a refractory material are used as a masking layer for the implantation, the masking layer may be left there during the heating, since they withstand the high temperatures used, so that the insulating layer 1 and the layer 3 may be left as the gate insulating layer and the gate electrode, respectively, in the voltage-controlled semiconductor device produced, therefor minimizing the masking steps required. As a result, the gate electrode 3 will also be self-aligned with respect to the near-surface layer 5, forming a source region layer with no overlap.

It is emphasized, however, that it is possible to use, for instance, an oxide as an insulating layer in a device produced by using the inventional method. In such case, the insulating layer may not be there during the diffusion step and no self-alignment will be obtained, although the self-alignment technique shown in FIGS. 1 and 2 will be preferred because of the very few masking steps resulting therefrom. Thus, the key of the present invention is that it utilizes the fact that donors practically do not at all diffuse in SiC but some acceptors do, to form a channel region layer.

After the heating step, a groove 9 (see FIG. 3) is etched through the layer 5 and into the layer 6 thereunder, whereupon a source 10 is deposited in contact with the source region layer 5 and the base layer 6. A suitable passivation layer, not shown in the figures, is thereafter applied on top of the layers of the device, and an aperture is finally etched through the passivation layer to the gate electrode 3 and means 11 for an external contact thereto are applied.

Figure 3:
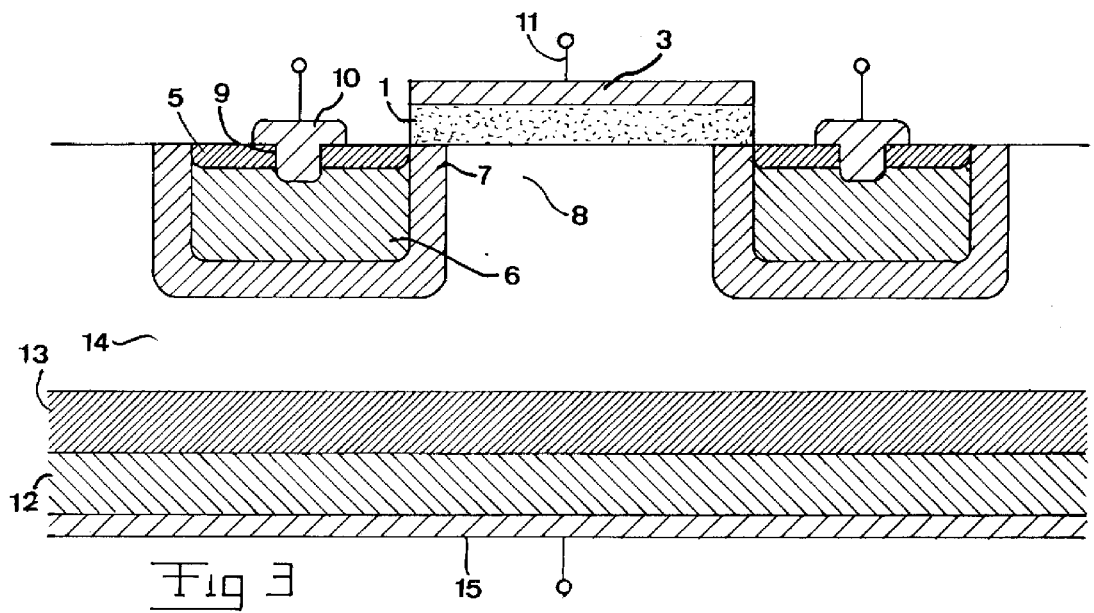
FIG. 3 is a schematic cross-section view illustrating how the voltage-controlled semiconductor device produced by utilizing the method steps illustrated in FIGS. 1 and 2 and further conventional steps may look.

The entire process for producing a voltage-controlled semiconductor device, which in this case is an IGBT, is started by epitaxially growing on top of each other the following semiconductor layers of SiC; a highly doped substrate layer 12 of p-type, a highly doped n-type buffer layer 13, and a low doped n-type drift layer 14. A drain 15 is applied in contact with the substrate layer 12. A MISFET may be produced in the same way but without the highly doped p-type layer 12. In the case of a MISFET, this may be said to be a VIMIS (Vertical Implanted MIS) having a similar construction as a DMOS in Si. Actually, two IGBTs produced in this way connected in parallel are shown in FIG. 3.

Typical dimensions for a device produced in this way are: a width of channel region layer of 0.3 μm, width of source region layer 0.2 μm, and depth of base layer 0.7 μm.

The invention is, of course, not in any way restricted to the preferred embodiment described above, but many possibilities or modifications thereof will be apparent to one skilled in the art without departing from the basic idea of the invention.

It is emphasized that the thicknesses of different layers in the figure are not to be interpreted as limiting the scope of the protection, but thickness relations are intended to be covered by the claims.

The number of layers mentioned in the claims is a minimum number, and it is within the scope of the invention to arrange further layers in the device, or divide any layer into several layers by selective doping of different regions thereof. It is not necessary that deep implantation of p-type dopants takes place, but it will be sufficient for forming the channel region layer that p-type dopants are implanted into a near-surface region of the SiC layer and thereafter that the heating is carried out for diffusion of the dopants therefrom for forming a channel region layer laterally to the highly doped n-type near-surface layer.

"Substrate layer" is, in this disclosure, to be interpreted as the layer closest to the drain of the layers mentioned and it does not have to be a substrate layer in the strict sense of this word within this field, i.e., the layer from which the growth is started. The real substrate layer may be any of the layers and it is mostly the thickest one.

The layers located on top of each other do not have to be epitaxially grown in the order they are mentioned in the claims, but any other order of growth of these layers is within the scope of the claims. For example, growth may be started from the drift layer and the so-called substrate layer and the drain may be grown at the very end of the method or conversely.

I claim:

1. A method for producing a doped p-type channel region layer having on laterally opposite sides thereof doped n-type regions in a SiC-layer for producing a voltage controlled semiconductor device, comprising the steps of:

1) applying a masking layer on top of a lightly n-doped SiC-layer, 2) etching an aperture in said masking layer extending to the SiC-layer, 3) implanting n-type dopants into an area of said SiC-layer defined by said aperture to obtain a high doping concentration of n-type in a near-surface layer of the SiC-layer under said area, 4) implanting p-type dopants into an area of the SiC-layer defined by said aperture, 5) heating said SiC-layer at such a temperature that p type dopants implanted in step 4) diffuse into the surrounding regions of the lightly n-doped SiC-layer to such a degree that a channel region layer in which p-type dopants dominate is created laterally to said highly doped n-type surface-near layer and between said layer and lightly n-doped regions of the SiC-layer, wherein said p-type dopants have a higher diffusion rate in SiC than said n-type dopants and are implanted to such a degree that the doping type in the lightly n-doped regions closest to said highly doped n-type near-surface layer may be shifted to p-type through diffusion of said p-type dopants, and wherein the steps 3) and 4) are carried out in one of a) the order mentioned and b) first step 4) and then step 3), such that, in either case the n-type doping of the near-surface layer is maintained.

2. A method according to claim 1, further comprising a step carried out after step 4) and before step 5) of removing said masking layer by etching.

3. A method according to claim 1, wherein the implantation in step 3) is carried out to different depths into said SiC-layer defined by said aperture, so that p-type dopants are implanted deeply into said area for creating a deep layer of p-type under said near-surface layer of n-type created in step 3).

4. A method according to claim 1, wherein boron is implanted as p-type dopant in step 4).

5. A method according to claim 1, wherein beryllium is implanted as p-type dopant in step 4).

6. A method according to claim 1, wherein the heating in step 5) is carried out at such a temperature that the dopants implanted in step 3) and 4) are made electrically active.

7. Method according to claim 4, wherein said heating in step 5) is carried out at a temperature above 1,650° C.

8. Method according to claim 7, wherein said heating in step 5) is carried out at a temperature below 1,800° C.

9. A method according to claim 1, wherein the width of the channel region layer is controlled by controlling the time period during which it is heated and the temperature at which it is heated in step 5).

10. A method according to claim 3, wherein said deep layer is created by using energies above 200 keV for the implantation in step 4).

11. A method according to claim 1, wherein the masking layer is applied in step 1) by applying an insulating layer of AlN on top of the SiC layer and a layer of a refractory material being a conductor of electricity on top of the AlN-layer, and wherein these two layers are left on the SiC-layer during step 5) for forming the gate insulating layer and the gate electrode, respectively, of the voltage-controlled semiconductor device produced.

12. A method according to claim 11, wherein TiN is applied in step 1) on top of said insulating layer for forming the layer for said gate electrode.

13. A method for producing a voltage-controlled semiconductor device of SiC, being one of a) a MISFET and b) an IGBT, said method comprising the steps of:

1) expitaxially growing on top of each other the following semiconductor layers of SiC: a highly doped substrate layer being for a) of n-type and for b) of p-type, for a) on top thereof a low doped n-type drift layer, and for b) on top thereof either one of c) a highly doped n-type buffer layer and a low doped n-type drift layer or d) a low doped n-type drift layer, 2) applying a masking layer on top of a lightly n-doped SiC layer, 3) etching an aperture in said masking layer extending to the SiC-layer, 4) implanting n-type dopants into an area of said SiC-layer defined by said aperture to obtain a high doping concentration of n-type in a near surface layer of the SiC layer under said area, forming a highly doped n-type source region layer, 5) implanting p-type dopants into an area of the SiC layer defined by said aperture, forming a doped p-type base layer located there under, 6) heating said SiC layer at such a temperature that p-type dopants implanted in step 4) diffuse into the surrounding regions of the lightly n-doped SiC layer to such a degree that a channel region layer in which p-type dopants dominate is created laterally to said highly doped n-type near surface layer and between said layer and lightly n-doped regions of the SiC layer, wherein said p-type dopants have a higher diffusion rate in SiC than said n-type dopants and are implanted to such a degree that the doping type in the lightly n-doped regions closest to said highly doped n-type near-surface layer may be shifted to p-type through diffusion of said p-type dopants, and wherein the steps 4) and 5) are carried out in one of a) the order mentioned and b) first step 5) and then step 4), such that, in either case the n-type doping of the near surface layer is maintained, 7) depositing a source electrode in contact with said highly doped n-type source region layer, 8) applying a passivation layer, 9) etching a second aperture through the passivation layer to said gate electrode and applying means for external contact thereto.

14. A method according to claim 13, further comprising a step of etching a groove through said highly doped n-type source region layer and into the p-type base layer located thereunder, carried out before step 8), and wherein said source electrode is deposited in said groove for forming a contact with both said p-type base layer and said n-type source region layer.

* * * * *